US009450016B2

(12) United States Patent
Xie (10) Patent No.: US 9,450,016 B2
(45) Date of Patent: *Sep. 20, 2016

(54) FLAT PANEL DETECTOR AND MANUFACTURING METHOD THEREOF, CAMERA DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/696,924

(22) Filed: Apr. 27, 2015

(65) Prior Publication Data

US 2015/0228691 A1  Aug. 13, 2015

Related U.S. Application Data

(62) Division of application No. 14/107,068, filed on Dec. 16, 2013, now Pat. No. 9,041,111.

(30) Foreign Application Priority Data

Jan. 23, 2013 (CN) .......................... 2013 1 0024573

(51) Int. Cl.
| H01L 21/00 | (2006.01) |
| H01L 21/84 | (2006.01) |
| H01L 27/146 | (2006.01) |
| H01L 27/12 | (2006.01) |

(52) U.S. Cl.
CPC ..... *H01L 27/14689* (2013.01); *H01L 27/1259* (2013.01); *H01L 27/14612* (2013.01); *H01L 27/14636* (2013.01); *H01L 27/14658* (2013.01); *H01L 27/14692* (2013.01)

(58) Field of Classification Search
CPC ................. H01L 27/14692; H01L 27/14658; H01L 27/146; H01L 27/14643; H01L 27/3248; H01L 27/3251; H01L 27/3262; H01L 27/3265; H01L 27/4658; H01L 29/49; H01L 29/4908; H01L 29/417; H01L 29/41733; H01L 29/207; H01L 29/6603; H01L 27/1463; H01L 27/1251; H01L 28/65; H01L 31/18; H01L 31/145; H01L 51/0508
USPC ............... 438/149, 270, 584, 605, 608, 700; 257/E21.006, E21.007, E21.045, 257/E21.17, E21.126, E21.127, E21.173, 257/E21.267, E21.304, E21.372, E21.411, 257/E21.423
See application file for complete search history.

(56) References Cited

U.S. PATENT DOCUMENTS

| 5,962,856 A | 10/1999 | Zhao et al. |
| 6,823,038 B2 | 11/2004 | Von Der Haar |

(Continued)

FOREIGN PATENT DOCUMENTS

| CN | 101025532 A | 8/2007 |
| CN | 101872770 A | 10/2010 |
| CN | 102881701 A | 1/2013 |

OTHER PUBLICATIONS

Second Chinese Office Action Appln. No. 201310024573.3; Dated May 25, 2015.

(Continued)

*Primary Examiner* — David Nhu
(74) *Attorney, Agent, or Firm* — Ladas & Parry LLP (57) ABSTRACT

A flat panel detector comprises a photoelectric conversion layer and a pixel detecting element disposed under the photoelectric conversion layer. The pixel detecting element comprises: a pixel electrode for receiving charges, a storage capacitor for storing the received charges, and a thin film transistor for controlling outputting of the stored charges. The storage capacitor comprises a first electrode and a second electrode. The first electrode comprises an upper electrode and a bottom electrode that are disposed opposite to each other and electrically connected. A second electrode is sandwiched between the upper electrode and the bottom electrode. It is insulated between the upper electrode and the second electrode and between the second electrode and the bottom electrode.

15 Claims, 4 Drawing Sheets

(56) References Cited

U.S. PATENT DOCUMENTS

| | | | |
|---|---|---|---|
| 7,053,380 B2 | 5/2006 | Homma et al. | |
| 7,816,651 B2 | 10/2010 | Green | |
| 8,389,343 B2 * | 3/2013 | Yamazaki | H01L 29/04 438/149 |
| 8,895,986 B2 * | 11/2014 | Xu | H01L 31/145 257/350 |
| 9,041,111 B2 * | 5/2015 | Xie | H01L 27/14692 257/300 |
| 2007/0194313 A1 | 8/2007 | Jung | |
| 2014/0077282 A1 | 3/2014 | Xu et al. | |

OTHER PUBLICATIONS

First Chinese Office Action dated Dec. 3, 2014; Appln. No. 201310024573.3.

USPTO RR dated Oct. 9, 2014 in connection with U.S. Appl. No. 14/107,068.

USPTO Ex Parte Quayle Action dated Dec. 24, 2014 in connection with U.S. Appl. No. 14/107,068.

USPTO NOA mailed Mar. 5, 2015 in connection with U.S. Appl. No. 14/107,068.

* cited by examiner

FLAT PANEL DETECTOR AND MANUFACTURING METHOD THEREOF, CAMERA DEVICE

The present application is a Divisional of 14/107,068 filed on Dec. 16, 2013, U.S. Pat. No. 9,041,111 B2, which claims priority of Chinese patent application No. 20131004573.3 filed on Jan. 23, 2013, the entire content of which is incorporated herein by reference.

TECHNICAL FIELD

Embodiments of the present disclosure relate to a flat panel detector and a method for manufacturing the same and a camera device provided with the flat panel detector.

BACKGROUND

At present, the digital radiography (DR) technology has been widely applied to medical instruments such as an X-ray scanner for imaging thorax. A key component of a DR device is the flat panel detector for acquiring images. The flat panel detector's performance will influence the quality of the acquired DR images significantly.

Figure 1:
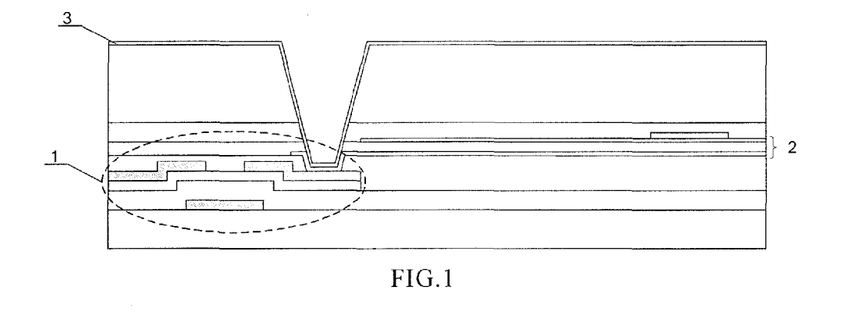
FIG. 1 is a structural view of a traditional flat panel detector.

At present, there are two kinds of flat panel detectors: amorphous selenium flat panel detectors and amorphous silicon flat panel detectors. As illustrated in FIG. 1, an amorphous selenium flat panel detector mainly consists of an amorphous selenium layer (not illustrated in FIG. 1), a pixel electrode 3, a storage capacitor 2 and a switching thin film transistor (TFT) 1. The incident X-ray makes the amorphous selenium layer to generate electron-hole pairs, and the electrons and holes move in opposite directions under the action of applied biasing electric field to form an electric current. The current passes through the pixel electrode 3 and brings about the stored charges in the storage capacitor 2, which are output to the readout circuit when the thin film transistor 1 is turned on. The amount of the stored charges output through each TFT corresponds to the dose of the incident X-ray. The amount of charges at each pixel point can be read by the readout circuit and the dose of X-ray at each pixel point can be further obtained.

SUMMARY

Embodiments of the present disclosure provide a flat panel detector and a method for manufacturing the same and a camera device provided with the flat panel detector, which can increase the capacity of a storage capacitor, enhance image acquiring capability, and hence facilitate to obtain the flat panel detector of high resolution.

One aspect of the present disclosure discloses a flat panel detector comprising: a substrate, a photoelectric conversion layer disposed on the substrate and a pixel detecting element disposed under the photoelectric conversion layer. The pixel detecting element comprises: a pixel electrode for receiving charges, a storage capacitor for storing the received charges, and a thin film transistor for controlling outputting of the stored charges. The storage capacitor comprises: a first electrode and a second electrode. A first electrode comprises an upper electrode and a bottom electrode that are disposed opposite to each other and electrically connected. A second electrode sandwiched between the upper electrode and the bottom electrode. It is insulated between the upper electrode and the second electrode and between the second electrode and the bottom electrode.

For example, the upper electrode and the bottom electrode may have a same pattern.

In one embodiment of the present disclosure, the bottom electrode may be disposed on the substrate and connected with a source of the thin film transistor through a via hole.

For example, the flat panel detector may further comprise: a first passivation layer covering the thin film transistor, and the second electrode is disposed on the first passivation layer.

For example, the flat panel detector may further comprise: a second passivation layer covering the second electrode, the upper electrode is disposed on the second passivation layer and connected with the source of the thin film transistor through via holes in the first passivation layer and the second passivation layer.

In one embodiment of the present disclosure, the bottom electrode is disposed on the substrate; the flat panel detector further comprises: a first passivation layer covering the thin film transistor, and the second electrode is disposed on the first passivation layer and connected with the source of the thin film transistor through a via hole.

For example, the flat panel detector may further comprise: a second passivation layer covering the second electrode, and the upper electrode is disposed on the second passivation layer and connected with the bottom electrode through a via hole.

For example, the flat panel detector may further comprise: a photosensitive resin layer disposed on the upper electrode, and the pixel electrode is disposed on the photosensitive resin layer and connected with the source of the thin film transistor through a via hole in the photosensitive resin layer.

For example, the thin film transistor comprises: a gate metal layer disposed on a substrate; a gate insulating layer covering the gate metal layer; an active layer disposed on the gate insulating layer; and a source-drain metal layer disposed on the active layer.

Another aspect of the present disclosure further provides a camera device comprising any of the above-mentioned flat panel detectors.

Yet another aspect of the present disclosure further provides a method for manufacturing a flat panel detector comprising: forming a first transparent conductive film and patterning the first transparent conductive film to form a bottom electrode; forming a gate metal layer, a gate insulating layer, an active layer and a source-drain metal layer of a thin film transistor; forming a first passivation layer and patterning the first passivation layer to form a first passivation layer via hole at a location corresponding to a source of the thin film transistor; forming a second transparent conductive film and patterning the second transparent conductive film to form a second electrode at a location corresponding to the bottom electrode; forming a second passivation layer and patterning the second passivation layer to form a second passivation layer via hole at a location corresponding to the first passivation layer via hole over the source of the thin film transistor; forming a third transparent conductive film and patterning the third transparent conductive film to form an upper electrode at a location corresponding to the bottom electrode, and the upper electrode is connected with the source of the thin film transistor through the first passivation layer via hole and the second passivation layer via hole.

For example, the upper electrode and the bottom electrode may have a same pattern.

For example, the method may further comprise: coating a photosensitive resin layer and patterning the photosensitive resin layer to form a photosensitive resin layer via hole at a location corresponding to the second passivation layer via hole; forming a fourth transparent conductive film and patterning the fourth transparent conductive film to form a pixel electrode, and the pixel electrode is connected with the source of the thin film transistor through the first passivation layer via hole, the second passivation layer via hole and the photosensitive resin layer via hole.

For example, after patterning to form the second electrode at a location corresponding to the upper electrode and before forming the second passivation layer, the method may further comprise: forming a metal layer on the second electrode and patterning metal layer to form a common electrode line.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

REFERENCE NUMERALS

1—Thin film transistor, 11—Gate metal layer, 12—Gate insulating layer, 13—Active layer, 14—Source—drain metal layer; 2—Storage capacitor, 21—Upper electrode, 22—Bottom electrode, 23—Second electrode; 3—Pixel electrode; 10—Substrate, 15—First passivation layer, 16—Second passivation layer, 17—Transition layer, 18—Common electrode line, 19—Connecting line, 20—Photosensitive resin layer, A—Via hole, B—Via hole.

DETAILED DESCRIPTION

As to the structure of the traditional flat panel detector as illustrated in FIG. 1, the inventor gained the following results in study. In designing the storage capacitor, the larger the storage capacitor is, the stronger the capability of storing charges and the stronger the capability of acquiring images. However increase of storage capacitor means increase of electrode area of the storage capacitor, and also parasitic capacitance between electrodes of the storage capacitor and other data lines increases given a constant pixel size. The parasitic capacitance influences the output signals of the data lines, leading to a poor SNR. If the pixel area is increased for reducing the parasitic capacitance, the aperture ratio of pixel is disadvantageously affected and a decreased resolution is incurred.

The embodiments of the present disclosure provide a flat panel detector and a method for manufacturing the same, which can increase the capacity of a storage capacitor and in turn enhances image acquiring capability and hence facilitate to obtain the flat panel detector of high resolution by connecting capacitors in parallel, without influencing aperture ratio of pixel.

The embodiments of the present disclosure will be described in detail below with reference to the drawings. Specific embodiments described herein are only for explaining the technical disclosure rather than limiting the technical disclosure.

It is noted that, for example, for transistors in the liquid crystal display field, there is no explicit difference between the drain and the source of a thin film transistor. Therefore as desired, a source of any transistor mentioned in the embodiments of the present disclosure may be replaced with a drain, and a drain may be replaced with a source as well.

Embodiment I

The present embodiment provides a flat panel detector comprising: a substrate; a photoelectric conversion layer disposed on the substrate for converting X-ray into charges, and a pixel detecting element disposed under the photoelectric conversion layer. The pixel detecting element comprises a pixel electrode for receiving charges, a storage capacitor for storing charges, and a switching element for controlling outputting of stored charges, which may be for example a thin film transistor.

Figure 2:
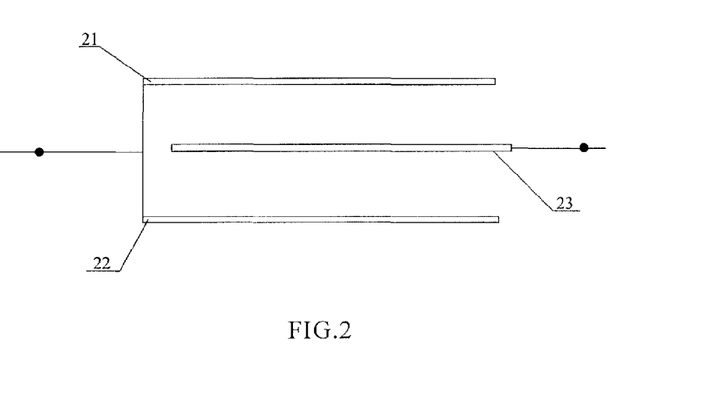
FIG. 2 is a structural view of a storage capacitor of the flat panel detector in embodiment I of the present disclosure.

As illustrated in FIG. 2 (only the storage capacitor is shown), the storage capacitor comprises a first electrode and a second electrode 23. The first electrode comprises in turn: an upper electrode 21 and a bottom electrode 22 disposed opposite to each other and are electrically connected together. The second electrode 23 is sandwiched between the upper electrode 21 and the bottom electrode 22. Both between the upper electrode 21 and the second electrode 23 and between the second electrode 23 and the bottom electrode 22, insulating layers are disposed (not shown).

In the flat panel detector of the present embodiment, the photoelectric conversion layer converts X-ray into charges, and pixel detecting elements independent to each other are disposed under the photoelectric conversion layer, and each of the pixel detecting element is used to collect information of one pixel. Each pixel detecting element comprises: a pixel electrode for receiving charges, a storage capacitor for storing the received charges, and a thin film transistor for controlling outputting of the stored charges.

In different device structures or at different locations of a device, for example, with respect to the structure of the thin film transistor, the insulating layer in the above-mentioned storage capacitor may be a gate insulating layer, or may be a passivation layer, or may be a composite layer in a dual-layer structure consisting of the gate insulating layer and the passivation layer. Of course, between the upper electrode 21 and the second electrode 23, and between the second electrode 23 and the bottom electrode 22, there may also be one or more intermediate layers for insulation, which is not limited to the passivation layer or the gate insulating layer. Therefore the present embodiment imposes no limitation thereto.

In the flat panel detector provided in the present embodiment, the upper electrode 21, the second electrode 23, and the insulating layer sandwiched between them together constitute a first capacitor; the bottom electrode 22, the second electrode 23, and the insulating layer sandwiched between them together constitute a second capacitor; the first capacitor and the second capacitor are connected in parallel to constitute the storage capacitor of the flat panel detector of the present embodiment; furthermore, the upper electrode overlaps the bottom electrode, and therefore no extra pixel area is occupied. Therefore, the storage capacitor can be increased without influencing the parasitic capacitance (the storage capacitor becomes the sum of the first capacitor and the second capacitor), which enhances image acquiring capability and also facilitate to obtain a flat panel detector of high resolution.

In order to ensure that the parasitic capacitance does not influence the detection effect of the flat panel detector, it is generally required to ensure that the capacitor electrodes and other data lines are spaced apart by a relatively long distance. Therefore, with the parallel connection of the capacitors in the present embodiment, while increasing storage capacitor, given that the distance between electrodes of the storage capacitor and other data lines is kept constant (still relatively far away), the change of parasitic capacitance can be neglected.

Embodiment II

Figure 3:
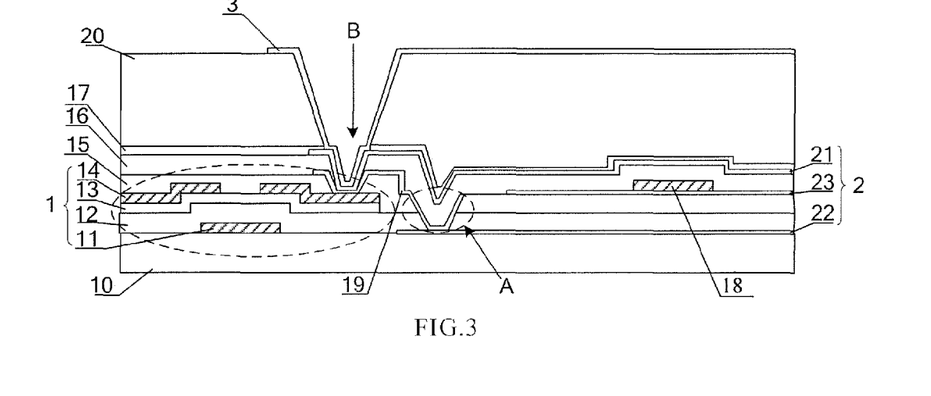
FIG. 3 is a structural view of the flat panel detector in embodiment II of the present disclosure.

The present embodiment provides a flat panel detector as illustrated in FIG. 3, comprising: a photoelectric conversion layer for converting X-ray into charges (not shown in the figure), and a pixel detecting element disposed under the photoelectric conversion layer (only one is shown in the figure). The pixel detecting element comprises a pixel electrode 3 for receiving the charges, a storage capacitor 2 for storing charges, and a thin film transistor 1 for controlling outputting of stored charges. The photoelectric conversion layer constitutes for example a photodiode, which is for example disposed on the pixel electrode 3.

The thin film transistor 1 comprises: a gate metal layer (comprising a gate electrode) 11 disposed on the substrate 10; a gate insulating layer 12 covering the gate metal layer 11; an active layer 13 disposed on the gate insulating layer 12; and a source-drain metal layer 14 disposed on the active layer 13. A first passivation layer 15 covers the thin film transistor 1, and is provided on the source-drain metal layer 14.

The storage capacitor 2 comprises a first electrode and a second electrode 23. The first electrode comprises an upper electrode 21 and a bottom electrode 22 disposed opposite to each other. The bottom electrode 22 of the storage capacitor 2 is disposed on the substrate, a gate insulating layer 12 covers the bottom electrode 22, and a first passivation layer 15 is disposed on the gate insulating layer 12. The first passivation layer 15 is formed after the thin film transistor 1 is formed and covers the gate insulating layer 12 in the area where the thin film transistor 1 and the storage capacitor 2 are disposed. The second electrode 23 is disposed on the first passivation layer 15. The first passivation layer 15 has a via hole B formed at a corresponding location over the source of the thin film transistor 1; and a via hole A is formed in the gate insulating layer 12 and the first passivation layer 15 in a region which the second electrode 23 does not cover and near the source of the thin film transistor 1. Along with forming of the second electrode 23, a connecting line 19 is formed. The connecting line 19 connects the bottom electrode 22 with the source of the thin film transistor 1 through the via hole A and the via hole B. A common electrode line 18 is further disposed on the second electrode 23 and connected directly with the second electrode 23, and a second passivation layer 16 is disposed thereon. The upper electrode 21 of the first electrode is disposed on the second passivation layer 16, a via hole is similarly formed at the corresponding location of the source of the thin film transistor 1 in the second passivation layer 16 (corresponding to via hole B on the first passivation layer 15). The location of this via hole overlaps with that of via hole B of the first passivation layer 15; this via hole exposes the source of the thin film transistor 1 in this via hole, and further the upper electrode 21 is connected to the source of the thin film transistor 1 through this via hole.

Of course, the upper electrode 21, the bottom electrode 22 and the second electrode 23 may also be flexibly disposed according to practical situation, as long as an insulating layer or other intermediate layer with insulation effect is disposed between the electrodes. For example, it is also possible that the bottom electrode 22 is disposed on the substrate 10, and the second electrode 23 is disposed on the gate insulating layer 12; in this case, the common electrode line 18 on the second electrode 23 may be formed along with the source-drain metal layer 14. The upper electrode 21 is disposed on the first passivation layer or still on the second passivation layer 16.

A photosensitive resin layer 20 is disposed on the thin film transistor 1 and the storage capacitor 2. Generally, in order to increase adhesiveness between the photosensitive resin material and the underlying metal material (e.g., upper electrode 21), prior to forming the photosensitive resin layer 20 by coating the photosensitive resin material, a thin transition layer 17 (e.g., a silicon nitride film) may be deposited first. The pixel electrode 3 is disposed on the photosensitive resin layer 20 and a conversion layer (such as amorphous selenium layer) is disposed on the pixel electrode 3 in turn. The photosensitive resin layer 20 and the transition layer 17 has a via hole formed at the corresponding position of the source of the thin film transistor 1 (corresponding to the via holes in the first passivation layer 15 and the second passivation layer 16); the via holes in the photosensitive resin layer 20, the first passivation layer 15 and the second passivation layer 16 over the source of the thin film transistor 1 overlap one another. With these via holes, the pixel electrode 3, the upper electrode 21, the bottom electrode 22 and the source of the thin film transistor 1 are connected together. Of course, the upper electrode 21 and the bottom electrode 22 can also be connected in this way.

In the flat panel detector of the present embodiment, the incident X-ray makes the photoelectric conversion layer (such as the amorphous selenium layer) to generate electron-hole pairs, the electrons and the holes move in opposite directions under the action of applied biasing electric field to form an electric current, and finally the incident X-ray is converted into an electrical signal. The pixel electrode receives the electrical signal that brings about the stored charges in the storage capacitor, and the thin film transistor controls the outputting of the stored charges. The amount of the output stored charges during each thin film transistor is turned on corresponds to the dose of the incident X-ray. Thereby the amount of the charges at each pixel point is read by the readout circuit, the dose of the X-ray of each pixel point is obtained and finally a radiography image is formed.

For example, the upper electrode 21 and the bottom electrode 22 may have the same pattern. The upper electrode 21 and the bottom electrode 22 may have the almost same size. Of course, the sizes of the upper electrode 21 and/or the bottom electrode 22 may be modified according to practical design requirements of the storage capacitor.

The flat panel detector provided in the present embodiment increases the capacity of a storage capacitor, enhances the image acquiring capability and hence facilitates to obtain a flat panel detector of high resolution by means of parallel connection of capacitors without influencing aperture ratio of pixel.

An embodiment of the present disclosure further provides a camera device comprising any of the above-mentioned flat panel detectors. It has a large storage capacitor and high image acquiring capability.

Embodiment III

The present embodiment provides a method for manufacturing a flat panel detector comprising the following process.

Figure 4:
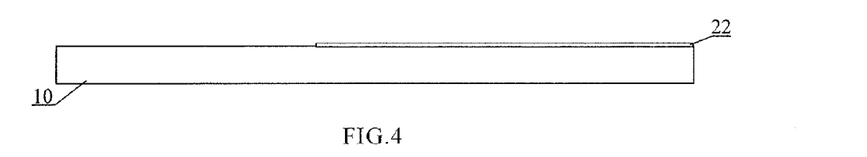
FIG. 4 is a structural view after forming a bottom electrode in embodiment III of the present disclosure.

Step 101, forming a first transparent conductive film and forming a bottom electrode 22 with a patterning process.

For example, a first transparent conductive film is formed on a substrate 10. A layer of photoresist is coated and then exposed and developed, and next a bottom electrode 22 is formed by etching the first transparent conductive film with a formed photoresist pattern. As illustrated in FIG. 4, the size of the bottom electrode 22 may be modified according to actual requirements of the storage capacitor.

Step 102, forming a gate metal layer, a gate insulating layer, an active layer and a source-drain metal layer of the thin film transistor.

The thin film transistor formed in this step will be described below with a bottom gate TFT (that is a gate formed under an active layer) as an example. However, it is obvious that the present disclosure is not limited to TFT in a bottom gate structure.

Figure 5:
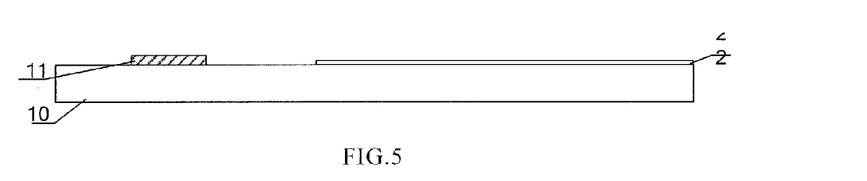
FIG. 5 is a structural view after forming a gate metal layer in embodiment III of the present disclosure.

Firstly, a gate metal layer 11 is formed. For example, a metal layer may be deposited on the substrate (such as a glass substrate) with a magnetron sputtering method. The metal layer may be a mono-layer film of AlNd, Al, Cu, Mo, MoW or Cr, or a composite film of one of or any combination of AlNd, Al, Cu, Mo, MoW or Cr. A layer of photoresist is coated, exposed and developed to form a gate electrode photoresist pattern. Then a gate electrode is formed by wet etching with the gate electrode photoresist pattern as illustrated in FIG. 5. Of course, it is also possible to form a gate metal layer 11 on the substrate and then form the bottom electrode 22 in step 101.

Figure 6:
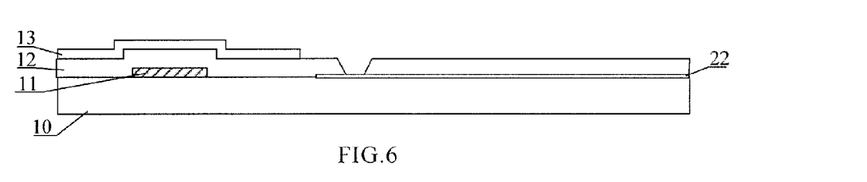
FIG. 6 is a structural view after forming the gate insulating layer and the active layer in embodiment III of the present disclosure.

Then, a gate insulating layer 12 and an active layer 13 are formed. For example, the gate insulating layer 12, the active layer amorphous silicon (a-Si) layer and the N doped amorphous silicon (N+a-Si) layer may be deposited with a PECVD method. Then a layer of photoresist is coated, exposed and developed to form an active layer photoresist pattern. The pattern of the active layer 13 is formed by wet etching with the active layer photoresist pattern as illustrated in FIG. 6. The gate insulating layer 12 has a via hole formed at the location near the source of the thin film transistor 1.

Figure 7:
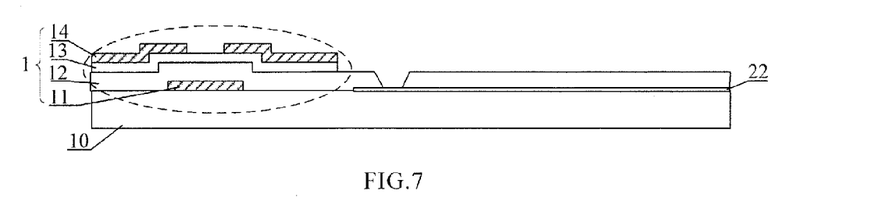
FIG. 7 is a structural view after forming a source-drain metal layer in embodiment III of the present disclosure.

Finally, the source-drain metal layer 14 is formed. For example, the metal layer may be deposited with a magnetron sputtering method. The metal layer material may be one of materials selectable for the gate electrode, preferably the materials with low resistance such as pure aluminum or pure copper. The source-drain metal layer 14 is formed by exposing, developing and etching, as illustrated in FIG. 7.

Figure 8:
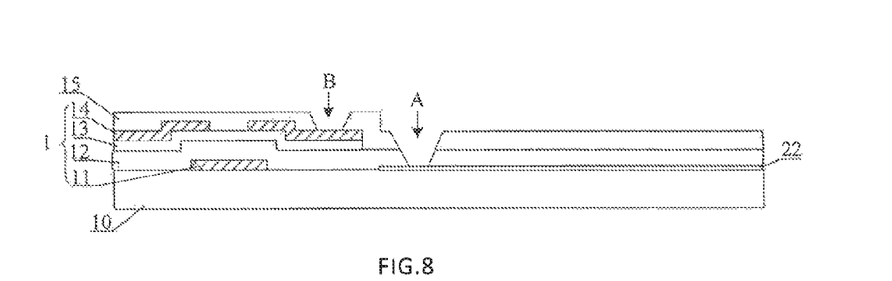
FIG. 8 is a structural view after forming a first passivation layer in embodiment III of the present disclosure.

Step 103, forming a first passivation layer 15 and disposing a first passivation layer via hole at a location corresponding to the source of the thin film transistor 1 with a patterning process.

In this step, for example, the first passivation layer 15 may be deposited with a PECVD method. A layer of photoresist is coated, exposed and developed. In addition to forming the via hole B in the first passivation layer at the location corresponding to the source of the thin film transistor 1, for connecting the bottom electrode 22 and the source of the thin film transistor 1, a via hole A is further formed at the location corresponding to the location of the via hole in the gate insulating layer 12 near the source of the thin film transistor 1 in the pixel region, and the via hole A exposes the underlying bottom electrode 22. In this way, the source of the thin film transistor 1 is exposed at the via hole B and the pattern of the bottom electrode 22 is exposed at the via hole A through a via hole etching process.

Figure 9:
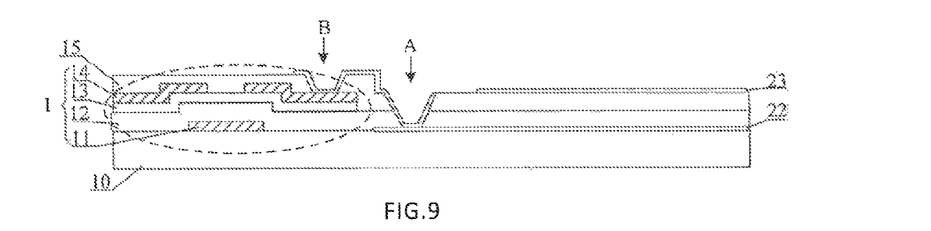
FIG. 9 is a structural view after forming a second electrode in embodiment III of the present disclosure.

Step 104, forming a second transparent conductive film and forming a second electrode 23 at a location corresponding to the bottom electrode 22 with a patterning process.

For example, in this step, the second transparent conductive film may be deposited with a magnetron sputtering method, and the second electrode 23 of the storage capacitor may be formed at the location corresponding to the bottom electrode 22 with a patterning process. In addition, while forming the second electrode 23, a connecting line 19 is formed at the same time between the via hole A and the via hole B (and in areas not covered by the second electrode 23). The connecting line 19 connects the bottom electrode 22 with the source of the thin film transistor 1 through the via hole A and the via hole B, as illustrated in FIG. 9.

Figure 10:
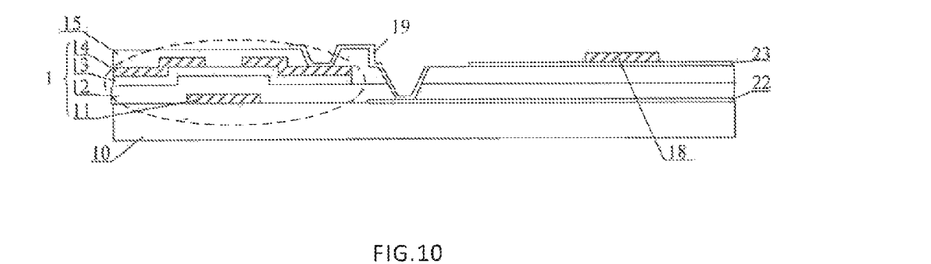
FIG. 10 is a structural view after forming a common electrode line in embodiment III of the present disclosure.

After forming the second electrode 23, a metal layer may be formed further on the second electrode 23, and a common electrode line 18 is formed with a patterning process. For example, the metal layer may be deposited with a magnetron sputtering method. The material of the metal layer may be one of materials selectable for the gate electrode, preferably the materials with low resistance such as pure aluminum and pure copper. The common electrode line 18 is formed after exposure, development and etching, as illustrated in FIG. 10. The common electrode line 18 covers and is connected directly with the second electrode 23.

Figure 11:
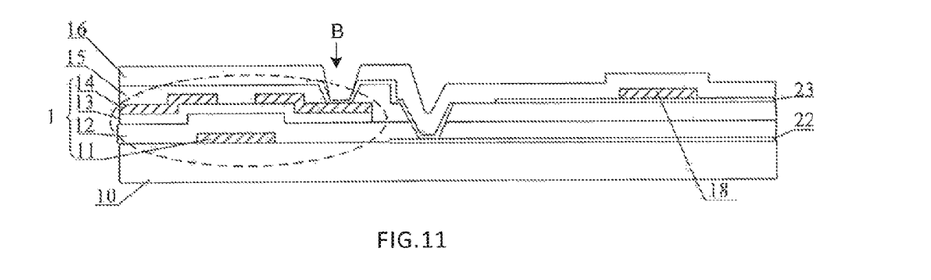
FIG. 11 is a structural view after forming a second passivation layer in embodiment III of the present disclosure.

Step 105, forming a second passivation layer 16 and forming a second passivation layer via hole at the location corresponding to the location of the via hole of the first passivation layer 15 over the source of the thin film transistor 1 with a patterning process.

For example, the second passivation layer 16 may be deposited with a PECVD method. After exposure, development and etching, a via hole C is formed in an area over the source of the thin film transistor 1, as illustrated in FIG. 11.

Figure 12:
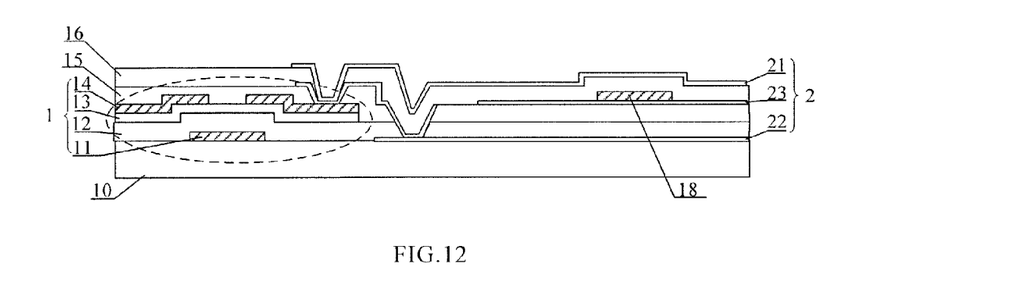
FIG. 12 is a structural view after forming an upper electrode in embodiment III of the present disclosure.

Step 106, forming a third transparent conductive film and forming an upper electrode 21 at the location corresponding to the bottom electrode 22 with a patterning process.

The upper electrode 21 is connected with the source of the thin film transistor 1 through the via hole in the first passivation layer and the via hole in the second passivation layer over the source of the thin film transistor 1.

For example, in this step, the third transparent conductive film is deposited with a magnetron sputtering method, and the pattern of the upper electrode 21 is formed after exposure, development and etching, and the upper electrode 21 is connected with the source of the thin film transistor 1 through the via hole in the second passivation layer 16. In this way, the bottom electrode 22 and the upper electrode 21 are connected together, and at the same time they form two parallel capacitors respectively with the second electrode 23, constituting a storage capacitor 2, as illustrated in FIG. 12.

The method for manufacturing the flat panel detector provided in the present embodiment increases the capacity of a storage capacitor, enhances the image acquiring capability and hence facilitate to obtain the flat panel detector of high resolution by forming parallel capacitors to constitute a storage capacitor without influencing aperture ratio of pixel.

Furthermore, the manufacturing method of the flat panel detector may further comprise the following process.

Figure 13:
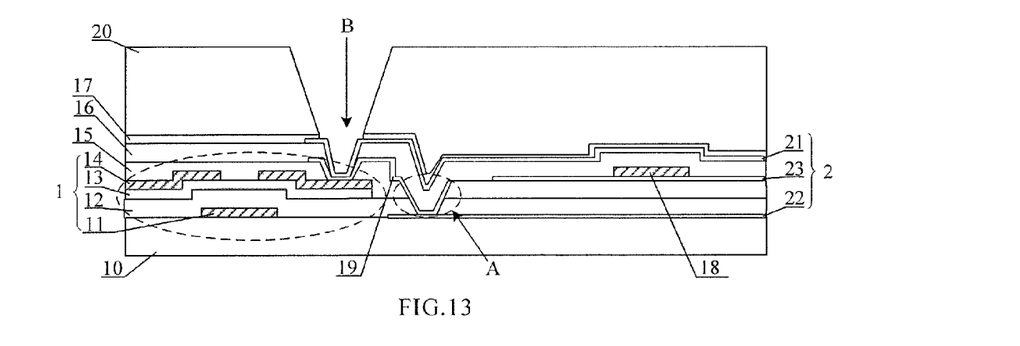
FIG. 13 is a structural view after forming photosensitive resin in embodiment III of the present disclosure.

Step 107, coating a photosensitive resin layer 20 and forming a photosensitive resin layer via hole at the location corresponding to the second passivation layer via hole over the source of the thin film transistor 1 (i.e., the location of the via hole B).

For example, the photosensitive resin layer 20 in this step is coated generally for the purpose of increasing adhesiveness between the photosensitive resin material and the underlying material (upper electrode 21). Before coating the photosensitive resin material to form the photosensitive resin layer 20, it is possible to deposit a thin layer of transition layer 17 first and then coat the photosensitive resin material in the way of spin coating for example. The thickness of the photosensitive resin material layer is generally in the range of 2 to 3 micrometer. After coating the photosensitive resin material layer, a via hole is formed in both the transition layer 17 and the photosensitive resin layer 20 at the location of the via hole of the second passivation layer. Briefly, the first passivation layer 15, the second passivation layer 16, the photosensitive resin layer 20, and the transition layer 17 are all provided with via holes therein over the source of the thin film transistor 1. This configuration allows for the connection of the pixel electrode 3, the upper electrode 21, the bottom electrode 22, and the source of the thin film transistor 1 through these via holes in the next step, as illustrated in FIG. 13.

Step 108, forming a fourth transparent conductive film and forming the pixel electrode 3 with a patterning process.

The pixel electrode 3 is connected with the source of the thin film transistor 1 through the first passivation layer via hole A, the second passivation layer via hole B and the photosensitive resin layer via hole C.

The subsequent process continues to form the photoelectric conversion layer, which completes the fabrication of the flat panel detector.

For example, the upper electrode 21 and the bottom electrode 22 may have a same pattern.

The method for manufacturing the flat panel detector provided in the present embodiment increases the capacity of a storage capacitor, enhances the image acquiring capability, and hence facilitate to obtain the flat panel detector of high resolution by forming parallel capacitors to constitute a storage capacitor without influencing aperture ratio of pixel.

Embodiment IV

Figure 14:
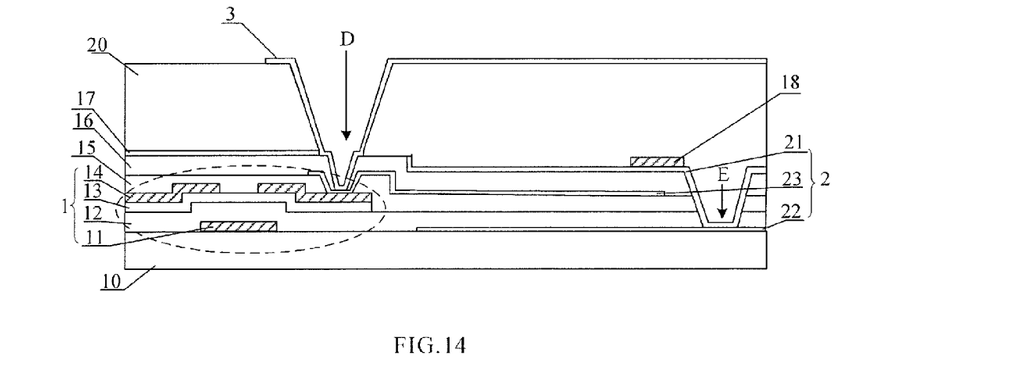
FIG. 14 is a structural view of another flat panel detector provided in embodiment IV of the present disclosure.

The present embodiment further provides another flat panel detector and a method for manufacturing the same, as illustrated in FIG. 14. The flat panel detector is different from embodiment 1 in that: the second electrode 23 is connected to the source of TFT through the via hole D; the upper electrode 21 and the bottom electrode 22 of the first electrode are connected through the via hole E; and the upper electrode 21 is not connected with the source of the thin film transistor 1. Also, in an example, a common electrode line 18 may be disposed on the upper electrode 21 (or the bottom electrode 22), that is, the upper electrode 21 and the bottom electrode 22 of the first electrode are connected with the common electrode line 18.

The manufacturing method of the flat panel detector according to the present embodiment is similar to embodiment III. The only difference lies in that the location of the via hole E formed in the gate insulating layer, the first passivation layer and the second passivation layer is different, and optionally the second electrode may also be on the gate insulating layer to be connected directly with the source of the TFT.

The capacity of the storage capacitor of the flat panel detector in the embodiments of the present disclosure is the sum of the capacities of the first and second capacitor, and the upper electrode overlaps the bottom electrode, which configuration does not occupy an extra pixel area. The distance between the electrodes of the storage capacitor and other data lines may be kept constant, and will not influence parasitic capacitance. Therefore it is not necessary to increase pixel area to reduce parasitic capacitance and the aperture ratio will not be influenced of course. The configuration increases the capacity of a storage capacitor, enhances the image acquiring capability and hence facilitates to obtain the flat panel detector of high resolution by applying parallel connection of capacitors without influencing aperture ratio of pixel.

The technical features described in embodiments of the present disclosure can be combined as desired if there is no collision.

What have been described above is only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of claims.

What is claimed is:

1. A method for manufacturing a flat panel detector, the method comprising:

forming a first transparent conductive film and patterning the first transparent conductive film to form a bottom electrode;

forming a gate metal layer, a gate insulating layer, an active layer and a source-drain metal layer of a thin film transistor;

forming a first passivation layer and patterning the first passivation layer to form a first passivation layer via hole at a location corresponding to a source of the thin film transistor;

forming a second transparent conductive film and patterning the second transparent conductive film to form a second electrode at a location corresponding to the bottom electrode;

forming a second passivation layer and patterning the second passivation layer to form a second passivation layer via hole at a location corresponding to the first passivation layer via hole over the source of the thin film transistor;

forming a third transparent conductive film and patterning the third transparent conductive film to form an upper electrode at a location corresponding to the bottom electrode, wherein the upper electrode is connected with the source of the thin film transistor through the first passivation layer via hole and the second passivation layer via hole.

2. The method of claim 1, wherein the upper electrode and the bottom electrode have a same pattern.

3. The method of claim 2, further comprising:
coating a photosensitive resin layer and patterning the photosensitive resin layer to form a photosensitive resin layer via hole at a location corresponding to the second passivation layer via hole; and
forming a fourth transparent conductive film and patterning the fourth transparent conductive film to form a pixel electrode, wherein the pixel electrode is connected with the source of the thin film transistor through the first passivation layer via hole, the second passivation layer via hole, and the photosensitive resin layer via hole.

4. The method of claim 1, wherein after patterning to form the second electrode at a location corresponding to the bottom electrode and before forming the second passivation layer, the method further comprises:
forming a metal layer on the second electrode and patterning the metal layer to form a common electrode line.

5. The method of claim 1, wherein a third via hole is formed in the gate insulating layer and the first passivation layer, the third via hole exposes the bottom electrode, and
the second transparent conductive film is patterned to further form a connecting line, wherein the connecting line connects the bottom electrode with the source through the third via hole and the first passivation layer via hole.

6. The method of claim 5, further comprising:
coating a photosensitive resin layer and patterning the photosensitive resin layer to form a photosensitive resin layer via hole at a location corresponding to the second passivation layer via hole; and
forming a fourth transparent conductive film and patterning the fourth transparent conductive film to form a pixel electrode, wherein the pixel electrode is connected with the source electrode of the thin film transistor through the first passivation layer via hole, the second passivation layer via hole, and the photosensitive resin layer via hole.

7. The method of claim 5, wherein after patterning to form the second electrode at a location corresponding to the bottom electrode and before forming the second passivation layer, the method further comprises:
forming a metal layer on the second electrode and patterning the metal layer to form a common electrode line.

8. The method of claim 5, wherein the upper electrode and the bottom electrode have a same pattern.

9. A method for manufacturing a flat panel detector, the mehtod comprising:
forming a first transparent conductive film and patterning the first transparent conductive film to form a bottom electrode;
forming a gate metal layer, a gate insulating layer, an active layer and a source-drain metal layer of a thin film transistor;
forming a first passivation layer and patterning the first passivation layer to form a first passivation layer via hole at a location corresponding to a source of the thin film transistor;
forming a second transparent conductive film and patterning the second transparent conductive film to form a second electrode at a location corresponding to the bottom electrode, wherein the second electrode is connected with the source electrode of the thin film transistor through the first passivation layer via hole;
forming a second passivation layer and patterning the second passivation layer to form a second passivation layer via hole at a location corresponding to the first passivation layer via hole over the source of the thin film transistor;
forming a third transparent conductive film and patterning the third transparent conductive film to form an upper electrode at a location corresponding to the bottom electrode, wherein a third via hole is formed in the gate insulating layer, the first passivation layer, and the second passivation layer, the upper electrode is connected with the bottom electrode through the third via hole.

10. The method of claim 9, wherein the upper electrode and the bottom electrode have a same pattern.

11. The method of claim 9, further comprising:
coating a photosensitive resin layer and patterning the photosensitive resin layer to form a photosensitive resin layer via hole at a location corresponding to the second passivation layer via hole; and
forming a fourth transparent conductive film and patterning the fourth transparent conductive film to form a pixel electrode, wherein the pixel electrode is connected with the source electrode of the thin film transistor through the first passivation layer via hole, the second passivation layer via hole, and the photosensitive resin layer via hole.

12. The method of claim 9, further comprising: forming a metal layer on the upper electrode and patterning the metal layer to form a common electrode line.

13. The method of claim 9, further comprising: forming a metal layer on the bottom electrode and patterning the metal layer to form a common electrode line.

14. The method of claim 11, further comprising: forming a metal layer on the upper electrode and patterning the metal layer to form a common electrode line.

15. The method of claim 11, further comprising: forming a metal layer on the bottom electrode and patterning the metal layer to form a common electrode line.

* * * * *